United States Patent

Sahlén

[11] Patent Number: 5,416,866
[45] Date of Patent: May 16, 1995

[54] OPTICAL WAVEGUIDE/GRATING DEVICE FOR FILTERING OPTICAL WAVELENGTHS

[75] Inventor: Olof G. Sahlén, Solna, Sweden

[73] Assignee: Telefonaktiebolaget L M Ericsson, Stockholm, Sweden

[21] Appl. No.: 111,573

[22] Filed: Aug. 25, 1993

[30] Foreign Application Priority Data

Aug. 26, 1992 [SE] Sweden .................... 9202446

[51] Int. Cl.$^6$ ............................................. G02B 6/34
[52] U.S. Cl. ........................................ 385/37; 385/14; 385/27; 385/41; 385/42; 385/131
[58] Field of Search ............... 385/1, 2, 3, 8, 10, 385/14, 15, 24, 27, 31, 37, 41, 42, 47, 49, 88, 89, 130, 131, 132; 372/20, 21, 22, 23, 43, 50, 102

[56] References Cited

U.S. PATENT DOCUMENTS

| | | | |
|---|---|---|---|
| 4,006,963 | 2/1977 | Baues et al. | 385/37 X |
| 4,743,087 | 5/1988 | Utaka et al. | 385/2 X |
| 4,750,801 | 6/1988 | Alferness | 385/37 X |
| 4,775,980 | 10/1988 | Chinone et al. | 372/102 X |
| 4,826,282 | 5/1989 | Alferness | 372/102 X |
| 5,007,705 | 4/1991 | Morey et al. | 385/37 X |
| 5,011,264 | 4/1991 | Bradley et al. | 385/2 X |
| 5,155,736 | 10/1992 | Ono et al. | 385/2 X |
| 5,233,187 | 8/1993 | Sakata et al. | 385/37 X |
| 5,285,274 | 2/1994 | Tanno et al. | 385/37 X |
| 5,339,157 | 8/1994 | Glance et al. | 385/24 |
| 5,351,324 | 9/1994 | Forman | 385/37 |
| 5,363,226 | 11/1994 | Strasser et al. | 385/37 X |
| 5,367,588 | 11/1994 | Hill et al. | 385/37 |

FOREIGN PATENT DOCUMENTS

| | | | |
|---|---|---|---|
| 0391334 | 10/1990 | European Pat. Off. | 385/37 X |
| 0397045 | 11/1990 | European Pat. Off. | 372/43 X |
| 0409177 | 1/1991 | European Pat. Off. | 372/43 X |
| 0479279 | 4/1992 | European Pat. Off. | 372/43 X |
| 0496348 | 7/1992 | European Pat. Off. | 372/43 X |

OTHER PUBLICATIONS

Patent Abstract of Japan vol. 14, No. 136 (P-102), abstract of JP 2-004209, publ. 9th Jan. 1990.

*Primary Examiner*—Brian Healy
*Attorney, Agent, or Firm*—Burns, Doane, Swecker & Mathis

[57] ABSTRACT

A tunable optical filter device has a wavelength selective optical filter that includes a grating structure arranged in a waveguide structure. The grating structure is formed so that it comprises two controllable grating sections electrically isolated from each other and which have different grating periods.

13 Claims, 3 Drawing Sheets

OPTICAL WAVEGUIDE/GRATING DEVICE FOR FILTERING OPTICAL WAVELENGTHS

BACKGROUND

The present invention relates to a tunable optical filter device comprising a wavelength selective optical filter comprising a grating structure arranged in a waveguide structure.

Important applications for wavelength tunable optical filters include optical transmission technology and optical switching within telecommunications. Further fields of application include optical connections, for example between printed circuit boards, partial systems etc. within a computer or a telephone station. Particularly, wavelength multiplexing can have significant importance within telenets, partly due to the difficulties which arise from dispersion in optical fibers in the construction of transmission systems intended to be used for long distances (for example more than 50 km) and with bit frequencies (per single wavelength channel) higher than 20–40 Gb/s. Furthermore, the flexibility becomes greater with wavelength multiplexing in the construction of optical exchanges, since different channels can be separated by the use of different wavelengths. With the help of filters as mentioned above, it is for example possible to filter out one out of many wavelength channels and the possibilities increase for both transmission and switching of a large information bandwidth and the filters also find application on both the receiver side and in the exchanges (switches) wherein different channels can be separated from each other.

It is thus desirable that the system in which the filters are used should be able to handle as many channels as possible, i.e. comprise an information bandwidth which is as large as possible.

In a number of different situations it is also advantageous to be able to fabricate tunable optical filters in the same material system as lasers, detectors, optical switch matrixes and modulators, particularly InGaAsP/InP for long wavelengths, 1300–1600 nm, and GaAs/AlGaAs for wavelengths between 800 and 900 nm.

It is a problem that, for physical reasons, the tuning range for such filters is limited. The exact value is therefore dependant on the choice of material composition (bandgap) in the waveguide material, the optical confinement factor (of the waveguide material thickness and the refractive index), doping level in the waveguide material and in the enclosing material and the thermal dissipation capacity of the component (thermal resistance). The greater the tuning range is, the more channels can be used. In a wavelength multiplexed system, the total information bandwidth (number of wavelength channels times bit velocity/channel) is proportional to the tuning range of the filter. Normally the tuning range of an optical filter is up to about 5 to 15 nm. It is therefore of significance to be able to obtain a tuning range particularly for a given combination of waveguide and material parameters which is as large as possible.

A number of solutions have been suggested for increasing the useable wavelength range of tunable filters, particularly waveguide based grating filters.

A number of different types of filters have been presented which are made in different material systems, such as glass, semi-conductors, polymers and litiumniobat.

One kind of filter comprises a single-mode waveguide with a grating which is etched into the waveguide, either in the waveguide layer itself or in a separate grating layer which can be separated from the waveguide layer by a distance of about some 100 nm. These filters can be used either as wavelength selective components per se or they can form part of the components of wavelength selective DBR-lasers (Distributed Bragg Reflector). A grating filter of this kind functions in such a way that only light within a narrow wavelength range centered around $\lambda_0$ is reflected and goes backwards in the waveguide, whereas the rest passes in the forward direction. By placing the high index material (InGaAsP or GaAs) in a P-I-N-transition with P- and N- doped low index layers above and below (double heterobarrier structure) a current can be injected. Using this current, a change, $\Delta n$, in refractive index n of the waveguide material is caused. This change in refractive index implies that the wavelength which is reflected shifts towards a shorter wavelength, $\Delta\lambda_0=(\lambda_0/n_{eff})\cdot\Delta n_{eff}$. The resonance wavelength $\lambda_0$ is given by the grating period according to $\lambda_0=2\cdot n_{eff}\Lambda$, where $\Lambda$ is the grating period. The change in effective index $\Delta n_{eff}$ is then approximately related to the change in the index $\Delta n$ of the waveguide material according to $\Delta n_{eff}\approx\Delta n\cdot\Gamma$, where $\Gamma$ is the confinement factor which determines how much of the power of the optical mode lies in the waveguide layer. The selectivity and the reflectance of the filter is essentially given by the length of the grating, L, and grating coupling-coefficient, $\kappa$. If the product $\kappa\cdot L$ exceeds 2 (approximately), a high reflectance is obtained, and the line width of the filter is uniquely defined by the value of $\kappa$. To obtain a good performance of the filter when it is used as a discrete component, i.e. when it is not monolithically integrated with other components on the same substrate, dielectric layers have to be deposited on both end surfaces to minimize reflectivity. Examples of filters are further described in EP-A-0 391 334.

One of the problems with these filters lies in the fact that the tuning range, $\Delta\lambda_{0\ max}$, is limited essentially to between 5 and 15 nm, the exact value depending on a number of factors such as material composition, optical confinement factor, doping level etc. The inherent physical limitation depends on the maximal chargecarrier density which can be injected to the active layer. Normally, it is desired to have a tuning range which is as large as possible, particularly greater than 5 to 15 nm since then among others more channels can be used in the system. In telecommunication systems a tuning range of about 20 to 30 nm is often desired which particularly corresponds to the wavelength window in which optical amplifiers, particularly so called erbium-doped fiber amplifiers or semiconductor laser amplifiers easily can be used.

In EP-A-0 391 334 a semiconductor laser-element is described which is tunable, wherein the so called Stark-effect is used. With this application, a decrease of the losses is achieved whereas no considerable increase of the tuning range is obtained.

EP-A-0 397 045 describes a semiconductor laser which can emit light in a larger wavelength range. A line-grating is used which at least comprises two different sub-gratings. These sub-gratings are, however, superposed on each other by use of double exposing on the same waveguide portion. The invention disclosed in said document relates to a laser and not to a separate optical filter. Furthermore, this device does not provide any satisfactory increase of the tuning range.

SUMMARY OF THE INVENTION

An object of the present invention is to provide a tunable optical filter device with a tuning range which is as large as possible, particularly the tuning range for a given combination of waveguide and material parameters is considerably larger than for conventional grating-based filters. It is furthermore an object of the invention to provide a device which is easy to produce and which is not expensive or difficult to fabricate because of a high complexity or similar reason. A further object of the invention is to achieve total tunability, which means that all wavelengths within the considered wavelength range can be selected. A further object of the invention is to provide a device with a small and well controlled filter bandwidth, a small through-damping and low crosstalk between different channels. Furthermore, it should be possible to make the device in the same material system as, for example, lasers, detectors, optical switching matrixes or modulators. It is furthermore an object with the invention to provide a filter which itself forms a component. According to a preferred embodiment, the device according to the invention can be integrated with another components.

These objects as well as others are achieved through a device wherein the grating structure comprises two controllable grating sections electrically isolated from each other and wherein the grating sections have different grating periods.

BRIEF DESCRIPTION OF THE DRAWINGS

The invention will be further described with reference to the accompanying drawings in an explanatory and by no means limiting way, wherein.

DETAILED DESCRIPTION OF THE INVENTION

Figure 1:
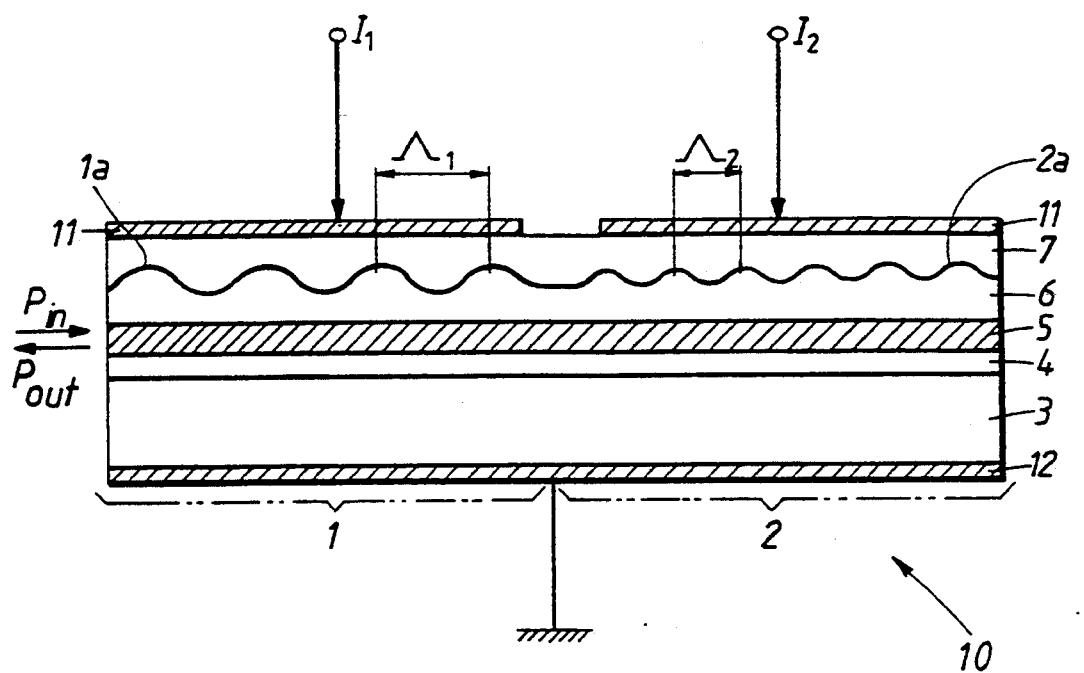
FIG. 1 shows a schematic cross-sectional view of a filter comprising two grating sections.

In the embodiment shown in FIG. 1, an active layer 5, particularly of indium gallium arsenide phosphide (InGaAsP) which is intrinsic, not doped and thus causes changes in refractive index, is arranged on a substrate 3 comprising for example indium phosphide (InP), in the shown embodiment n-doped, $n^+$, and with a thickness of about 500 $\mu$m. This active layer 5 is particularly grown on the substrate 1, as eventually also a buffer layer of the same material as the substrate 3 arranged on the substrate 1 for facilitating the growing. The growing is achieved through epitaxy and the size of the possibly present buffer layer 4 may reach about 1 $\mu$m. On top of the active layer 5, a layer 6 is arranged which preferably comprises InGaAsP which, however, has a composition which is somewhat different from that of the active layer 5. For example layer 6 may have a larger bandgap and a different refractive index than layer 5. On this waveguide layer 6 a first grating 1a and a second grating 2a with different grating periods $\Lambda_1$ and $\Lambda_2$ respectively are etched forming a first 1 and a second grating section 2. On top of the first and the second grating respectively, a layer 7 is arranged which for example comprises pure indium phosphide, InP. The first 1a and the second 2a grating respectively form a boundary surface between the waveguide layer 6 and layer 7. Current injection electrodes 11 and 12 respectively are arranged on the layer 7 and the substrate 3 respectively. In the Figure, $I_1$ illustrates the current which is injected to the first grating section 1, whereas $I_2$ represents the current which is injected to the grating section 2. $P_{in}$ represents to the device incident light whereas $P_{out}$ represents outcoming light.

Thus, FIG. 1 illustrates two grating sections 1 and 2 which are electrically isolated from each other, the first section 1 having a grating period $\Lambda_1$ which is longer than the grating period $\Lambda_2$ of the second grating section 2. The different grating sections can, for example, be obtained through electronbeam lithography, wherethrough gratings with an optional and variable period can be produced. The electrical isolation can be achieved through a combination of etching and implantation of, for example, protons or helium ions. The grating sections 1 and 2 each have a tuning range $(\Delta\lambda_0)_{max}$ which for example can be about 10 nm, with the two tuning ranges somewhat overlapping; in principal it is sufficient that they contact each other but for practical reasons it is desirable to have a certain margin in the form of an overlap.

Figure 3A:
Figure 3B:
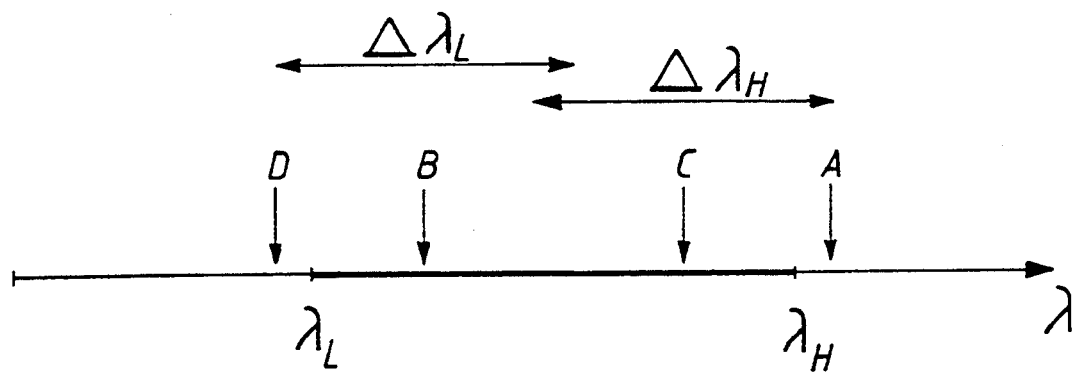

In the following will be described in a simplified manner how the device can be used. The actual wavelength range, i.e. the range within which the different channels are located, is supposed to go from $\lambda_L$ to $\lambda_H$, as schematically illustrated in FIG. 3a. The two grating periods $\Lambda_1$ and $\Lambda_2$ are now selected in such a way, as illustrated in FIG. 3b, that section 1 is tunable over the upper half of the interval whereas section 2 is tunable on the lower half of the interval. The grating period $\Lambda_1$ of section 1 is chosen sufficiently large so that the section is completely transparent when the current through section 1 is zero; which should be true for all wavelengths within the interval $[\lambda_L, \lambda_H]$. Thus, if a channel with a wavelength which falls within the lower half of the interval is to be filtered out, no current is injected to section 1 so that the first section 1 will be "parked" in position A in FIG. 3b. Thereafter the current $I_2$ through section 2 is chosen in such a way that the desired channel, for example B, is filtered out. If, on the other hand a channel, C, within the upper half of the interval is to be filtered out, an appropriate current $I_1$ is injected to section 1. At the same time the current through section 2 is chosen sufficiently large so that the resonance wavelength of the grating is displaced to position D, i.e. to a wavelength which is shorter than any one of the wavelengths which corresponds to the channels within the interval $[\lambda_L, \lambda_H]$. Thus it will be apparent that it is generally not possible to double the total tuning range, mainly for two reasons. First, a certain overlap between the grating filters 1, 2 is convenient for practical reasons. Such an overlap can for example reach about 1 nm. Further, a part of the accessible tuning range of each grating section or grating filters 1, 2 must be used for "parking" the respective grating outside the interval $[\lambda_L, \lambda_H]$. The internal sequence of the two sections 1, 2 is of importance. When a current is injected in the waveguide for changing the refractive index, a certain increase of the absorption is obtained, i.e. the losses increase, at the same time. Thus, it is essential that section 1 has a grating period $\Lambda_1$ which is longer than the grating period $\Lambda_2$ of section 2 so that section 1 can be "parked" in its rest position, position A, without any current injection, i.e. without the wavelength channel which is filtered out by section 2 suffering any losses at its double passage through section 1. Furthermore, if both sections 1, 2 are "parked" in their respective end-positions (in FIG. 3b corresponding to A and D respectively), the whole device will be transparent to all wavelengths within the interval [$\lambda_L$, $\lambda_H$]. With the device it is e.g. possible to either filter out one of all the channels or to let all channels pass through the device unaltered.

In the following, possible values of wavelengths, etc., are given to illustrate how much the tuning range of an optical filter would be increased through being divided into two grating sections 1, 2, compared to an undivided optical filter. In the described embodiment, the light signals are supposed to be centered around a wavelength of 1550 nm. Furthermore, it is assumed that the waveguide material 6 comprises 300 nm undoped InGaAsP (grating adapted to InP) and has a luminescence wavelength of 1400 nm, whereas the filter sections 1, 2 respectively are characterized by a grating coupling coefficient $\kappa$ of 15 cm$^{-1}$. In this case the tuning range of a grating section 1 and 2 respectively is about 10 nm whereas the smallest possible distance between different channels is about 1 nm, assuming that the crosstalk is less than $-10$ dB. With the device according to the invention, the number of accessible channels is increased from 10, which corresponds to one single section, to 17, which corresponds to two sections 1, 2. Consequently, depending on the exact form of the device, in particular the linewidth of the filter and the number of channels within the desired wavelength interval, the total tuning range increases by about 60-80% compared to the case with only one homogenous grating section.

Through the invention all wavelengths within the interval [$\lambda_L$, $\lambda_H$] are accessible.

Figure 2:
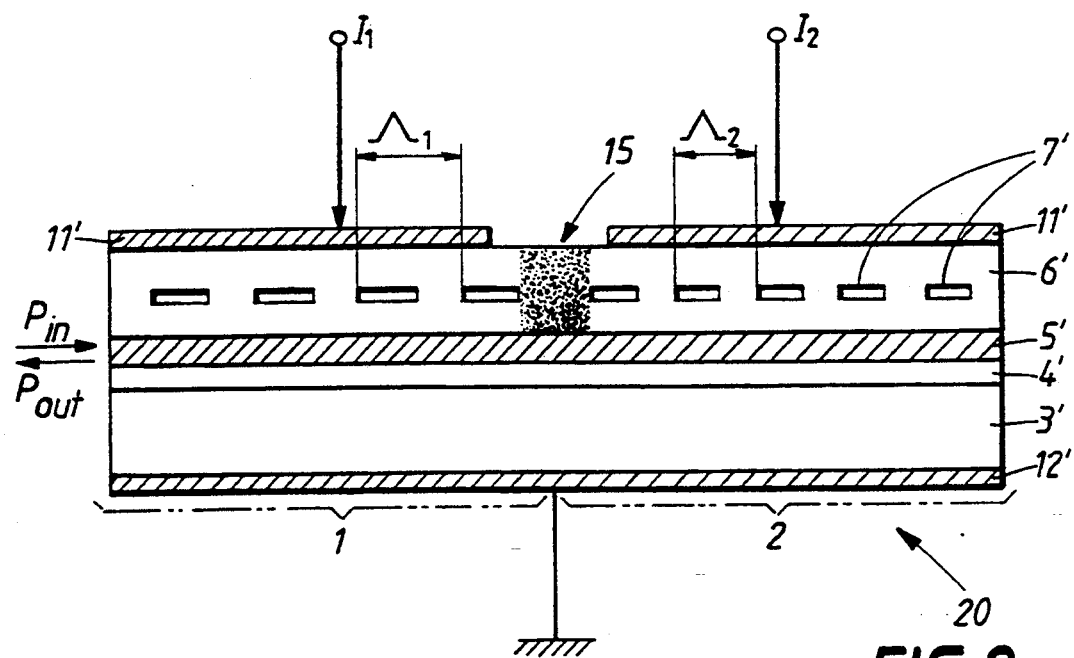
FIG. 2 shows a cross-sectional view of a second embodiment of a filter according to the invention, FIG. 3a schematically illustrates information-carrying channels within a wavelength range, FIG. 3b schematically illustrates how the wavelengths of FIG. 3a are covered by each of the two sections, FIG. 4 schematically illustrates a device according to the invention comprising an amplifying section.

In FIG. 2, a device 20 is illustrated which is similar to the device 10 described in FIG. 1, and comprises a single mode optical waveguide fabricated on a semiconductor substrate with two separate electrically isolated grating sections 1', 2'. On a thick substrate 3' which, in the shown embodiment, comprises n-doped indium phosphide (n+ —InP), with a buffer layer 4' of the same material as the substrate 3', is grown, for example with MBE (Molecular Beam Epitaxy) or MOVPE (Metalorganic Vapor Phase Epitaxy), an active layer 5' of undoped indiumgalliumarsenidephosphide (i-InGaAsP), which layer thus causes the change in refractive index, and a layer of p-doped indiumphosphide (p+ —InP) in which the grating is formed with the help of indiumgalliumarsenidephosphide arranged in the indiumphosphide layer 6' in such a way that a grating period $\Lambda_1$ is obtained in section 1, whereas another, and smaller, grating period $\Lambda_2$ is obtained in section 2. In the transition between the two sections 1, 2 the material is partly amorphorized with the help of, for example, proton bombardment or similar to give high electrical resistance, which corresponds to the area which is indicated by reference numeral 15 in FIG. 2. On the top, two electrodes 11' 11' are illustrated corresponding to each section 1, 2 for injection of a current $I_1$, $I_2$, whereas a metal eletrode 12' is arranged at the bottom.

Generally, for the embodiment according to FIG. 1 as well as for the embodiment according to FIG. 2, the device is fabricated in a form of a doubleheterobarrier-structure in a semiconductor (for example the GaAs-/AlGaAs-system or the InGaAsP/InP-system) wherein the gratings e.g. can be defined by electronbeam lithography or any other similar lithographic technology followed by etching.

Figure 4:
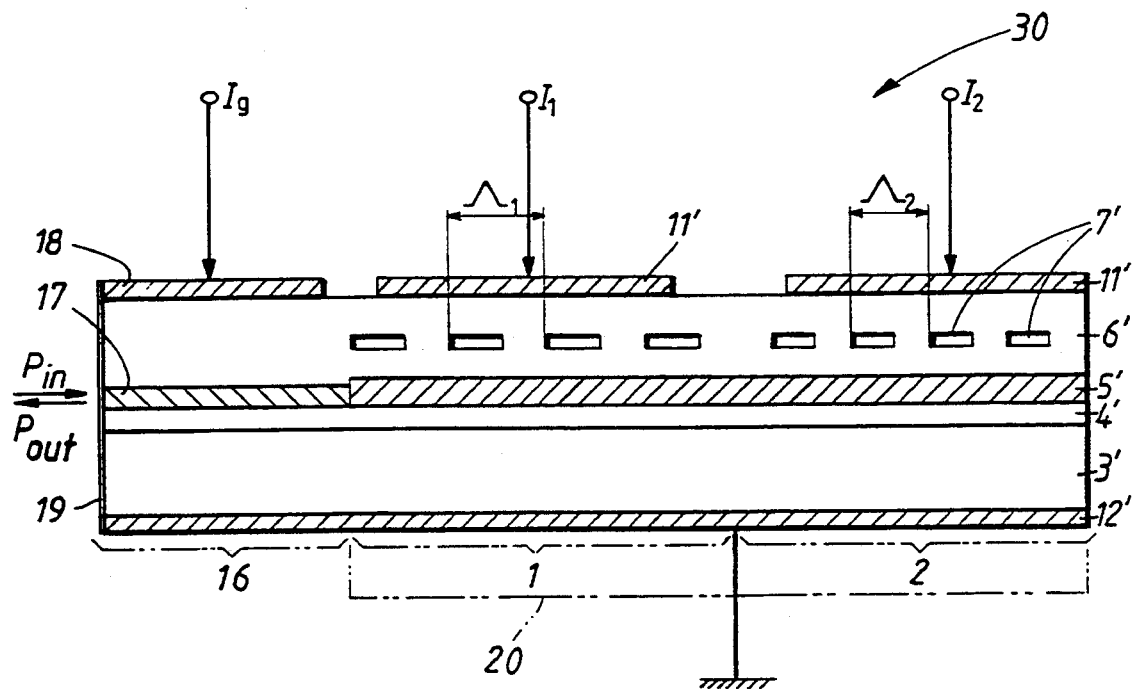

FIG. 4 shows a device 30 in connection with which an optical amplifier in the form of an extra waveguide section 16 is arranged, without grating, and with a smaller bandgap than the tunable grating sections 1, 2 which can be monolithically integrated. This is operated with forward voltage and with a sufficient current injection $I_g$, the amplifying current, stimulated amplification is obtained. A device according to FIG. 4 compensates for damping and losses at the in- and outcoupling of light to/from the component and produces a filter without losses. The active material or the layer 17 in the amplifying section 16 has a bandgap which is smaller than that in the active layer 5' of the grating sections, 1, 2 corresponding to the filter, so that stimulated amplification is obtained at the signal wavelength when a current is injected. To the amplifying section 16 a current $I_g$ is injected to the electrode 18. According to one embodiment the bandgap of the active material in the amplifier, $E_g$, could reach about 0.8 eV, whereas the bandgap of the active material of the filter 20 could reach about $E_g = 1.0$ eV. The amplifying section comprises an antireflection layer or coating 19.

According to a further alternative embodiment, the invention comprises a grating assisted directional coupler 40. This makes it possible to separate incident from reflected signals by using two coupled waveguides 21, 22. The two waveguides 21, 22 can be parallel and the second waveguide 22 has a dispersion characteristic different from that of the first waveguide 21 and, is separated, e.g. laterally or heightwise from the first waveguide.

Figure 5:
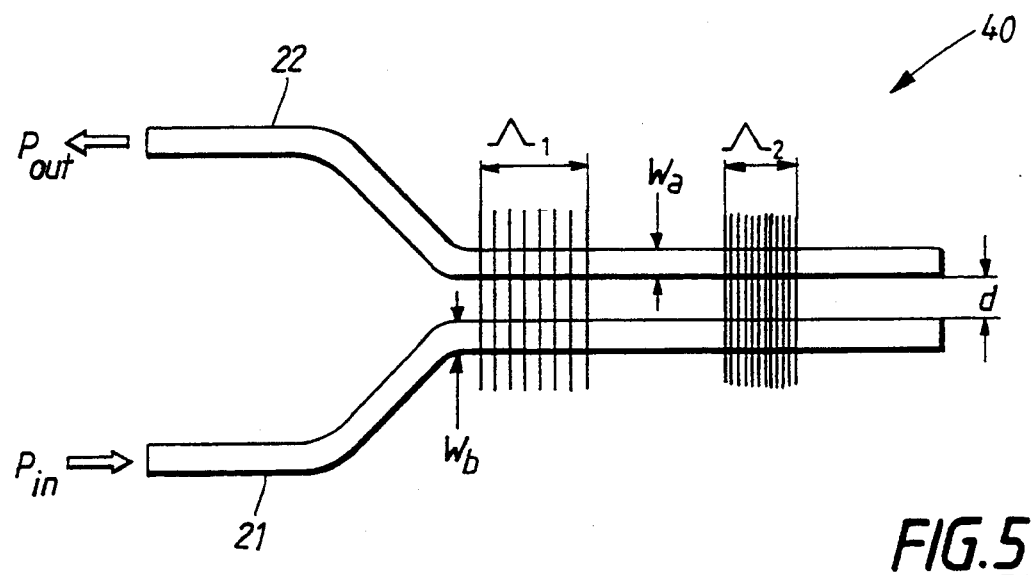
FIG. 5 illustrates a device according to the invention formed as a grating-assisted directional coupler.

In FIG. 5 are schematically illustrated two parallel coupled waveguides, one for incident light and the other for reflected light which are essentially arranged parallel to one another. The thickness ($w_a$) and the material composition of the second waveguide 22 are somewhat different from the first waveguide 21 ($w_b$) so that these have dispersion characteristics which differ from each other. The grating period is so chosen that reflection is obtained in the backward direction, from waveguide 21 to waveguide 22. In the figure the sections corresponding to different grating constants have been schematically illustrated and are denoted $\Lambda_1$ and $\Lambda_2$. The distance d between the waveguides can be of about 0.5-5 $\mu$m in the shown embodiment, preferably 0.2-2 $\mu$m.

According to an alternative embodiment, it is instead possible to create a refractive index change in the form of an increase by applying a reverse voltage, for example via the so called Stark-shift in quantum well structures. In this manner, the refractive index is thus changed in a positive way with increasing reverse voltage, at the same time as the absorption increases with increasing reverse voltage. According to this embodiment, the internal sequence of the two sections is reversed so that $\Lambda_l$ is smaller than $\Lambda_2$ in order to achieve a minimization of absorption losses. This means consequently that section 1 should be able to be "parked" in the shortwavelength end position, corresponding to zero voltage on the feeding electrode of the section, and thus produce only insignificant losses for signal wavelengths which go through the first section to be reflected by the second section.

Naturally, the invention is not limited to the shown embodiments but can be freely varied within the scope of the claims. Thus, for example, different materials or material systems can be used, different sections can be adjointed, etc., as well as the principle and the way in which a grating is obtained. Different combinations with further components of different kinds etc are also possible.

What is claimed is:

1. A tunable optical filter device comprising a grating structure arranged in a waveguide structure, wherein the grating structure comprises two controllable grating sections electrically isolated from each other, the grating sections having different grating periods; and light of a predetermined wavelength that enters the waveguide structure is reflected back through the waveguide structure by the grating structure.

2. A device as in claim 1, wherein the waveguide structure comprises a single mode waveguide fabricated in a semiconductor substrate.

3. A device as in claim 1, further comprising for each grating section, means for changing the refractive index of the corresponding grating section.

4. A device as in claim 3, wherein each said means for changing the refractive index comprises means for injecting a current to said corresponding grating section.

5. A device as in claim 1, wherein the grating sections are arranged consecutively in the direction of propagation of light entering the tunable optical filter device, and wherein further each grating section has a corresponding tuning range.

6. A device as in claim 5, wherein the tuning ranges somewhat overlap.

7. A device as in claim 6, wherein the overlap of the tuning ranges is about 1 nm.

8. A device as in claim 1, wherein the grating period of the first grating section in the direction of propagation of light entering the device is longer than the grating period of the second grating section.

9. A device as in claim 1, wherein the different grating sections are so arranged that losses due to induced absorption are minimized when one grating section in sequence with another grating section is used to filter out a desired channel or wavelength.

10. A device as in claim 1, wherein the lowest and highest wavelengths respectively corresponding to the total tuning range of the tunable optical filter device are respectively smaller and greater a lowest and highest wavelength of a range of channels so that the channel range is completely covered by the total tuning range of the device.

11. A device as in claim 1, further comprising an active layer that comprises quantum wells instead of bulk material, and wherein further a change of refractive index in each of the grating sections respectively is achieved by applying a reverse voltage so that the refractive index is increased.

12. A tunable grating assisted directional coupler comprising a grating structure with two controllable grating sections being electrically separated from each other, the grating structure being included in a waveguide structure comprising two waveguides arranged in parallel, the waveguides having different dispersion characteristics from one another and being separated from each other laterally or vertically by a given distance, the grating sections further having different grating periods.

13. A tunable optical filter device comprising a wavelength selective optical filter comprising a grating structure in a first waveguide section, the grating structure including two controllable grating sections which are electrically separated from each other and having different grating periods, the optical filter further comprising a second waveguide section forming an amplifying section, whereby a device for stimulated amplification is formed.

* * * * *